(12) United States Patent
Kwon et al.

(10) Patent No.: US 6,724,245 B2
(45) Date of Patent: Apr. 20, 2004

(54) BOOSTING CIRCUIT

(75) Inventors: Yi Jin Kwon, Ichon-Shi (KR); Dae Han Kim, Ichon-Shi (KR)

(73) Assignee: Hynix Semiconductor, Kyungki-do (KR)

( * ) Notice: Subject to any disclaimer, the term of this patent is extended or adjusted under 35 U.S.C. 154(b) by 0 days.

(21) Appl. No.: 10/329,460

(22) Filed: Dec. 27, 2002

(65) Prior Publication Data

US 2004/0012437 A1 Jan. 22, 2004

(30) Foreign Application Priority Data

Jul. 18, 2002 (KR) .................................. 10-2002-42170

(51) Int. Cl.[7] .............................................. H03K 5/08
(52) U.S. Cl. ...................................... 327/589; 327/321
(58) Field of Search ................................. 327/309, 318, 327/319, 321, 327, 328, 390, 589

(56) References Cited

U.S. PATENT DOCUMENTS

| 5,387,830 | A | * | 2/1995 | Kukimoto | 327/322 |
| 5,929,686 | A | * | 7/1999 | Itou | 327/321 |
| 6,559,707 | B1 | * | 5/2003 | Hwang | 327/390 |

* cited by examiner

*Primary Examiner*—Jeffrey Zweizig
(74) *Attorney, Agent, or Firm*—Morgan, Lewis & Bockius LLP

(57) ABSTRACT

The present invention relates to a boosting circuit. A boosting voltage (VBOOT) is dropped to a given voltage level through a pre-select clamp circuit and the boosting voltage (VBOOT) is again dropped through a clamp circuit, depending on the power supply voltage, so that a final target word line voltage is generated. Accordingly, a read access time is rapid upon a read operation, the current consumption is minimized and a stabilized word line voltage can be generated.

15 Claims, 7 Drawing Sheets

BOOSTING CIRCUIT

BACKGROUND OF THE INVENTION

1. Field of the Invention

The invention relates generally to a boosting circuit, and more particularly to, a boosting circuit capable of reducing a read access time upon a data read operation in a memory cell of a semiconductor device, minimizing loss of current and generating a stabilized word line voltage.

2. Description of the Prior Art

In a memory cell of EEPROM (electrically erasable and programmable read only memory) being a kind of a non-volatile semiconductor memory device, a program operation is performed in which electrons are accumulated at a floating gate electrode. A read operation is performed in which variation in the threshold voltage (Vth) depending on whether the electrons exist or not is detected. The EEPROM includes a flash EEPROM (hereinafter called 'flash memory device') in which data is erased in the entire memory cell array or data is erased in a block unit by dividing the memory cell array in given blocks.

Generally, the memory cells of the flash memory cell are classified into a stack gate type and a split gate type, depending on its structure. For example, as shown in FIG. 8, the memory cell of the stack gate type includes a source region 804 and a drain region 806 that are formed in a semiconductor substrate 802, and a gate oxide film 808, a floating gate 810, a dielectric film 812 and a control gate 814 that are sequentially formed on the semiconductor substrate 802.

The program operation of the memory cell of the stack gate type is performed by applying a ground voltage (0V), a source voltage (Vs) and a bulk voltage (Vb) to the source region 804 and the semiconductor substrate 802 (i.e., bulk), respectively, a gate voltage (Vg) of a positive high voltage (program voltage) (for example, +9V through +10V) to the control gate 814, and a drain voltage (Vd) (for example, +5V through +6V) to the drain region 806, in order to generate hot carriers, as shown in Table 1 below and FIG. 9. The hot carriers are generated since electrons in the bulk are accumulated at the floating gate 810 by an electric field of the gate voltage (Vg) applied to the control gate 814 and electric charges supplied to the drain region 806 are accumulated. After the program operation is finished, the memory cells have a program threshold voltage of a target program voltage range (for example, 6V through 7V).

The erase operation of the memory cell of the stack gate type is performed by applying a negative high voltage (erase voltage) (for example, −9V through −10V) to the control gate 814 and the bulk voltage (Vb) (for example, +5V through +6V) to the bulk, in order to cause a F-N (Fowler-Nordheim) tunneling phenomenon, as shown in Table 1 below. The memory cells are erased in a sector unit sharing the bulk region. The F-N tunneling phenomenon serves to discharge the electrons accumulated at the floating gate 808 to the source region 804, so that the memory cells have an erase threshold voltage of a given voltage range (for example, 1V through 3V).

In the memory cells threshold voltages of which are increased through the program operation, injection of current into the source region 804 from the drain region 806 is prevented upon the read operation, so that the memory cells are in an off state. Also, in the memory cells the threshold voltage of which is lowered through the erase operation, current is injected from the drain region 806 to the source region 804, so that they are in an on state.

In the structure of the flash memory array, the flash memory cells are constructed to share the bulk region for high-integration. Therefore, the flash memory cells included in a single sector are simultaneously erased. At this time, if all the flash memory cells are erased at the same time, some flash memory cells (hereinafter, called 'over-erased memory cells') having the threshold voltage of below 0V, of the flash memory cells, exist due to uniformity of the threshold voltage held by the respective flash memory cells. In order to compensate for this, an over-erase repair operation for distributing the threshold voltage of the over-erased flash memory cells within the erase threshold voltage range is performed. As in Table 1 below, the over-erase repair operation is performed by applying the gate voltage (Vg) (for example, +3V) to the control gate 814 and the drain voltage (Vd) (for example, +5 through +6V) to the drain region 806, and also grounding the source region 804 and the bulk.

TABLE 1

| Operation Mode | Gate Voltage (Vg) | Drain Voltage (Vd) | Source Voltage (Vs) | Bulk Voltage (Vb) |
|---|---|---|---|---|
| Program Operation | +9 V~+10 V | +5 V~+6 V | 0 V | 0 V |
| Erase Operation | −7 V~−8 V | Floating | Floating | +8 V~+9 V |
| Over-Erase Repair Operation | +3 V | +5 V~+6 V | 0 V | 0 V |
| Read Operation | +3.5~+4.5 V | +1 V | 0 V | 0 V |

As described above, in order for the program operation, erase operation and read operation of the flash memory device to be performed, a function of the high voltage generating circuit for generating high voltages (for example, Vpgm (program voltage), Vera (erase voltage) and Vrea (read voltage)) supplied to the control gate of the memory cell is very important.

Recently, as there is a trend that all the semiconductor memory devices have a low voltage, the operation of the flash memory device under an ultra low voltage (for example, below 2V or below 1.7V) is required. In line with this trend, in order to maintain a rapid operation speed of, the flash memory device, a function of the high voltage generating circuit is very important.

The read voltage generating circuit for performing the read operation in the high voltage generating circuit includes the bootstrapping circuit in order to increase the read operation speed. The bootstrapping trap circuit uses a low-potential power supply voltage to boost it and then supplies the boosted voltage to the word lines via a row decoder. In case that the low-potential power supply voltage is boosted using the bootstrapping circuit, if the voltage of the word line boosted by the bootstrapping circuit is too low, it is difficult to exactly read current of the memory cell. On the contrary, if the voltage of the word line is too high, there occurs a problem in data retention since stress is applied to the control gate of the memory cell.

In the above, in order to solve the latter case, a clamp circuit for dropping the voltage that is too high boosted by the bootstrapping circuit (hereinafter, called 'the boosting voltage') to a target voltage, is posited at the rear of the bootstrapping circuit. This will be below described by reference to FIG. 10.

FIG. 10 is a block diagram of the boosting circuit of a common flash memory device. Meanwhile, 'VDIV' among the signals in FIG. 12 below is a divided voltage that is generated in a clamp circuit 1030 and is compared with the reference voltage (Vref). Also, 'W/L' is a voltage that is applied to a word line.

Referring now to FIG. 10, the boosting circuit 1000 includes a bootstrapping circuit 1010, a reference voltage generator 1020 and a clamp circuit 1030. The bootstrapping circuit 1010 boosts the low-potential power supply voltage (Low Vcc; LVcc) (for example, 2.5V) or the high-potential power supply voltage (High Vcc; HVcc) (for example, 3.8V) to output the boosted voltage. The reference voltage generator 1020 is constructed depending on the enable bar signal (Enb) being a synchronization signal to output the reference voltage (Vref). Also, the clamp circuit 1030 is driven by an enable signal (EN) and an enable bar signal (ENb) to compare the boosting voltage (VBOOT) from the bootstrapping circuit 1010 and the reference voltage (Vref). If the boosting voltage (VBOOT) is higher than the reference voltage (Vref), the clamp circuit 1030 drops the boosting voltage (VBOOT) to a target voltage to output a word line voltage.

Meanwhile, the enable signal (EN) and the enable bar signal (ENb) could be obtained thorough an enable signal generating circuit 1100 shown in FIG. 11. The enable signal generating circuit 1100 includes a NOR gate (NOR) for negatively logically combining the clamp enable signal (clamp_en) to drive the clamp circuit 1030 and the clamp signal (clamp) being an output signal of the clamp circuit 1030, an inverter (INV1) for inverting an output signal of the NOR gate (NOR), and an inverter (INV2) for inverting the output signal the inverter (INV1) (i.e., the enable signal (EN)) to output the enable bar signal (ENb).

However, this boosting circuit 1000 uses the clamp circuit 1030 in order to generate the word line voltage. Therefore, as shown in FIG. 12, a stable word line voltage could not be generated. Further, in order to generate the stable word line voltage, an access time (that is, time consumed to drop the boosting voltage to the target voltage) is delayed. In addition, if a rapid access time is considered in an effort to solve this problem, many problems are occurred in stabilizing the semiconductor device since the word line voltage is under shoot (see 'A' in FIG. 12). Also, there is a problem that read active current could not be controlled in the low-potential power supply voltage (LVcc) region that is not sensed in a clamping period.

SUMMARY OF THE INVENTION

The present invention is contrived to solve the above problems and an object of the present invention is to generate rapid and stabilized word line voltage upon a data read operation.

In order to accomplish the above object, a boosting circuit according to the present invention, is characterized in that it comprises a booth trap circuit for boosting a first voltage to output a second voltage, a pre-select clamp circuit selectively driven by a bias voltage to drop the second voltage to a given voltage level, wherein the amount of the bias voltage is determined by the amount of the first voltage, and a clamp circuit for dropping the second voltage that is dropped by the pre-select clamp circuit to a target voltage.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
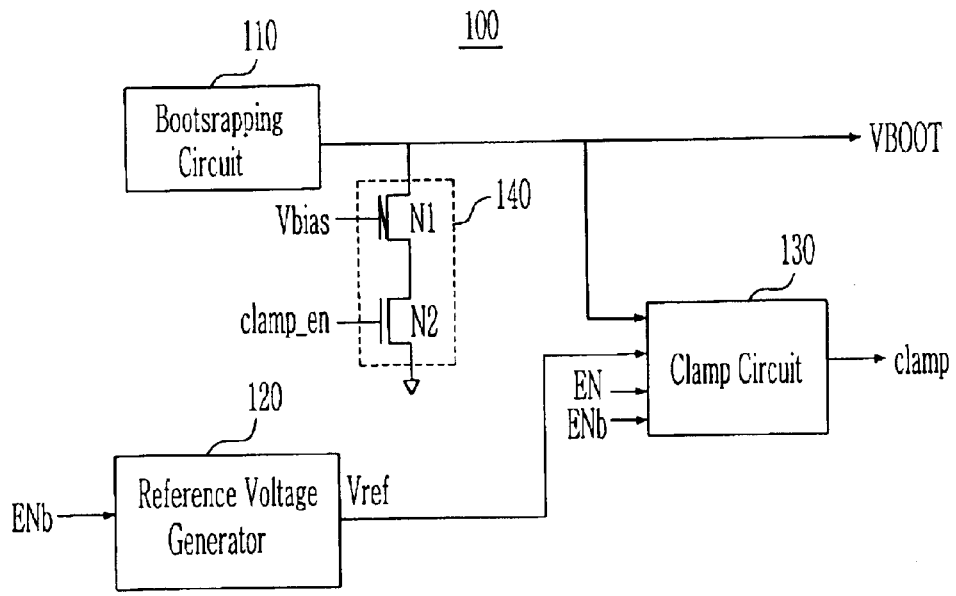
FIG. 1 is a block diagram of a boosting circuit according to a preferred embodiment of the present invention.

The present invention will be described in detail by way of a preferred embodiment with reference to accompanying drawings, in which like reference numerals are used to identify the same or similar parts.

FIG. 1 is a block diagram of a boosting circuit according to a preferred embodiment of the present invention.

Referring now to FIG. 1, the boosting circuit 100 includes a bootstrapping circuit 110, a reference voltage generator 120 and a clamp circuit 130. The boosting circuit 100 further includes a circuit (hereinafter, called 'pre-select clamp circuit 140) that is selectively driven by a low-potential power supply voltage (LVcc), for example 2.5V or a high-potential power supply voltage (HVcc), for example 3.8V applied to the bootstrapping circuit 110 to in advance drop a boosting voltage (VBOOT) of the bootstrapping circuit 110 to a given voltage level.

In more detail, the bootstrapping circuit 110 boosts the low-potential power supply voltage (LVcc) or the high-potential power supply voltage (HVcc) (for example, by about 2 through 3 times) to output the boosting voltage (VBOOT). The reference voltage generator 120 is synchronized by the enable bar signal (ENb) being an inverted signal of the enable signal (EN) to generate the reference voltage (Vref). The clamp circuit 130 serves to compare the boosting voltage (VBOOT) and the reference voltage (Vref) when the high-potential power supply voltage (HVcc) is applied to the bootstrapping circuit 110. Depending on the comparison result, the clamp circuit 130 drops the boosting voltage (VBOOT) to output the word line voltage. Meanwhile, the clamp circuit 130 does not operate when the low-potential power supply voltage (LVcc) is applied to the bootstrapping circuit 110. Generally, the clamp circuit is designed not to operate at the low-potential power supply voltage (LVcc).

The pre-select clamp circuit 140 includes a NMOS1 transistor (N1) and a NMOS transistor (N2) serially connected between an output terminal of the bootstrapping circuit 110 and a ground terminal (Vss), as shown in FIG. 1. The NMOS1 transistor (N1) is turned on by the bias voltage (Vbias) and the NMOS transistor (N2) is turned on by the clamp enable signal (clamp_en). Operating characteristics of the NMOS transistors (N1) and the NMOS transistors (N2) will be described.

The NMOS transistor (N1) of the pre-select clamp circuit 140 is applied with the bias voltage (Vbias) having a different voltage level depending on the high-potential power supply voltage (HVcc) or the low-potential power supply voltage (LVcc). The charge drivability of the NMOS transistor (N1) is changed depending on the voltage level of the bias voltage (Vbias). Accordingly, the amount of current that bypasses the NMOS transistor (N1) is varied. In other words, if the voltage level of the bias voltage (Vbias) is high, the channel width of the NMOS transistor (N1) is widely formed, so that lots of current are passed. On the contrary, if the voltage level of the bias voltage (Vbias) is low, the channel width of the NMOS1 transistor (N1) is narrowly formed, so that small amount of current is passed. Therefore, if the NMOS2 transistor (N2) is turned on by the clamp enable signal (clamp_en), the discharging amount of the boosting voltage (VBOOT) is determined depending on the voltage level of the bias voltage (Vbias). At this time, it should be noted that the NMOS transistor (N1) and the NMOS transistor (N2) are one example, PMOS transistors may be used instead of the NMOS transistors and the number of the transistors may be varied.

Meanwhile, the bias voltage (Vbias) to control the NMOS transistor (N1) of the pre-select clamp circuit 140 is obtained from a generating circuit 200 shown in FIG. 2 (hereinafter, called 'bias voltage generating circuit'). The bias voltage generating circuit 200 is driven by the enable bar signal (ENb). The low-potential power supply voltage (LVcc) or the high-potential power supply voltage (HVcc) is applied to the power supply terminal (Vcc) of the bias voltage generating circuit 200. The bias voltage generating circuit 200 also drops the low-potential power supply voltage (LVcc) or the high-potential power supply voltage (HVcc), depending on the enable bar signal (ENb), to a given level, and then outputs the bias voltage (Vbias). For example, like a waveform A and a waveform B shown in FIG. 4 and FIG. 7, if the low-potential power supply voltage (LVcc) of 2.5V is applied, the bias voltage (Vbias) becomes a voltage level of 0.7V. If the high-potential power supply voltage (HVcc) of 3.8V is applied, the bias voltage (Vbias) becomes a voltage level of 2.4V. This can be implemented by adequately adjusting W/L (Width/length)of respective transistors N3, N4, N5, N6, N7, P1 and P2 shown in FIG. 2. At this time, the waveform A is one illustrating that the bias voltage (Vbias) is dropped to 2.4V when the high-potential power supply voltage (HVcc) of 3.8V is applied. Also, the waveform B is one illustrating that the bias voltage (Vbias) is dropped to 0.7V when the low-potential power supply voltage (LVcc) of 2.5V is applied.

Figure 2:
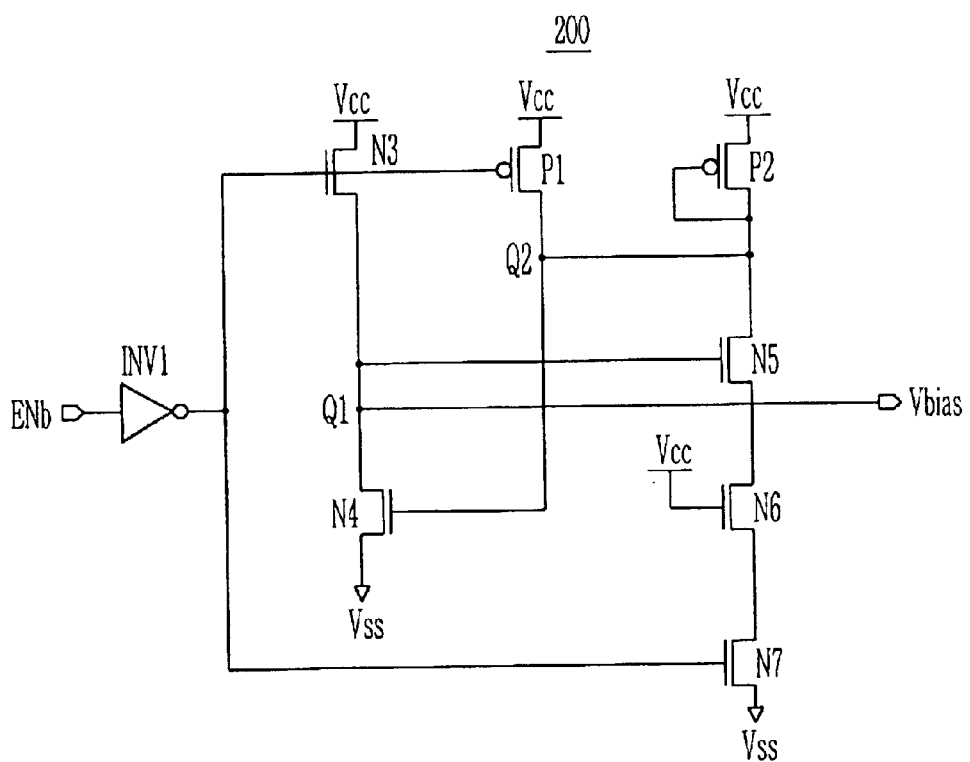
FIG. 2 is a detailed circuit diagram of a bias voltage generating circuit for generating a bias voltage (Vbias) shown in FIG. 1.

In concrete, as shown in FIG. 2, the bias voltage generating circuit 200 includes an inverter (INV1), a NMOS transistor (N3), a NMOS transistor (N4), a NMOS transistor (N5), a NMOS transistor (N6), a NMOS transistor (N7), a PMOS transistor (P1) and a PMOS transistor (P2). The inverter (INV1) inverts the enable bar signal (ENb). The NMOS transistor (N3) is connected between the power supply terminal (Vcc) and a node (Q1) from which the bias voltage (Vbias) is outputted and is driven by an output signal of the inverter (INV1). The NMOS transistor (N4) is connected between the node (Q1) and the ground terminal (Vss) and is driven by the voltage of the node (Q2). The PMOS transistor (P1) is connected between the power supply terminal (Vcc) and the node (Q2) and is driven by the output signal of the inverter (INV1). The PMOS transistor (P2) is connected between the power supply terminal (Vcc) and the node (Q2). Also, a gate electrode of the PMOS transistor (P2) is connected to its source electrode. The PMOS transistor (P2) serves as a diode. The NMOS transistor (N5) is connected between the node (Q2) and the NMOS transistor (N6) and is driven by the voltage of the node (Q1). The NMOS transistor (N6) is connected between the NMOS transistor (N5) and the NMOS7 transistor (N7) and is driven by the low-potential power supply voltage (LVcc) or the high-potential power supply voltage (HVcc) applied to the power supply terminal (Vcc). The NMOS transistor (N7) is connected between the NMOS transistor (N6) and the ground terminal (Vss) and is driven by the output signal of the inverter (INV1).

Figure 3:
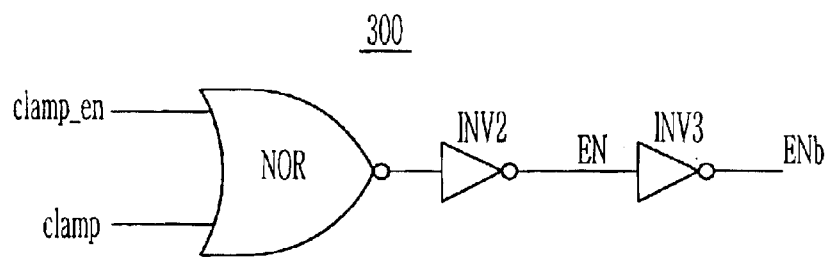
FIG. 3 is a circuit diagram of an enable signal generating circuit for generating an enable signal (EN) shown in FIG. 1.

In FIG. 1 and FIG. 2, the enable signal (EN) and the enable bar signal (ENb) for driving the clamp circuit 130 and the reference voltage generator 120 are generated by a generating circuit (hereinafter, called 'enable signal generating circuit') (see 200 in FIG. 3). The enable signal generating circuit 300 includes the clamp enable signal (clamp_en) for driving the clamp circuit (see 130 in FIG. 1), a NOR gate (NOR) for negatively logically combining the clamp signal of the clamp circuit 130, an inverter (INV2) for inverting the output signal of the NOR gate (NOR), and an inverter (INV3) for inverting the output signal (i.e., the enable signal (EN)) of the inverter (INV2) to generate the enable bar signal (ENb). This enable signal generating circuit 300 serves to reduce a read active current. This is because the enable signal (EN) can be activated in a sensing period since the enable signal generating circuit 300 logically combines the clamp enable signal (clamp_en) and the clamp signal (clamp) to generate the enable signal (EN). Accordingly, the clamp circuit 130 can be driven by controlling the enable signal (EN). Also, though it was described that the enable signal generating circuit 300 serves to logically combine the clamp enable signal (clamp_en) and the clamp signal (clamp) of the clamp circuit 130 using the NOR gate (NOR), this is one example. Instead, it can be implemented using other gates (NAND gate, AND gate, OR gate, etc.).

Figure 4:
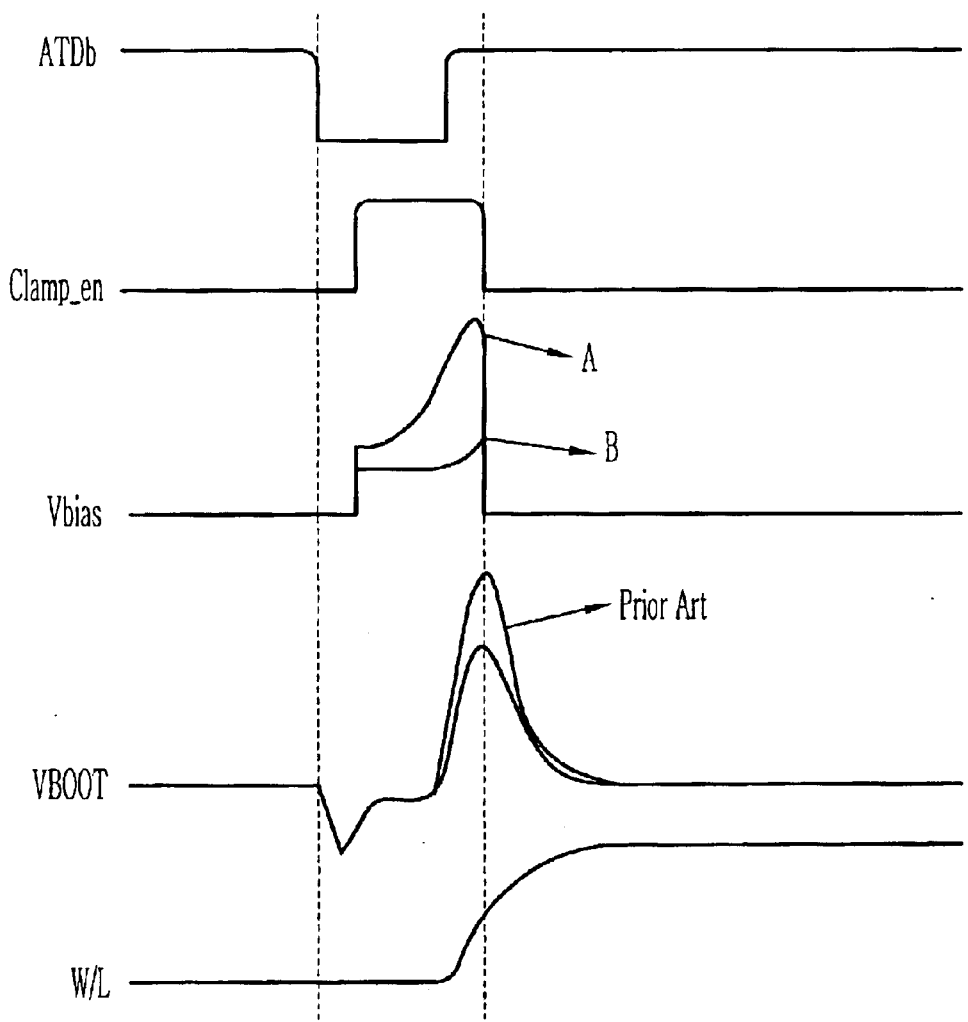
FIG. 4 shows a waveform for explaining an operating characteristic of the boosting circuit shown in FIG. 1.
Figure 5:
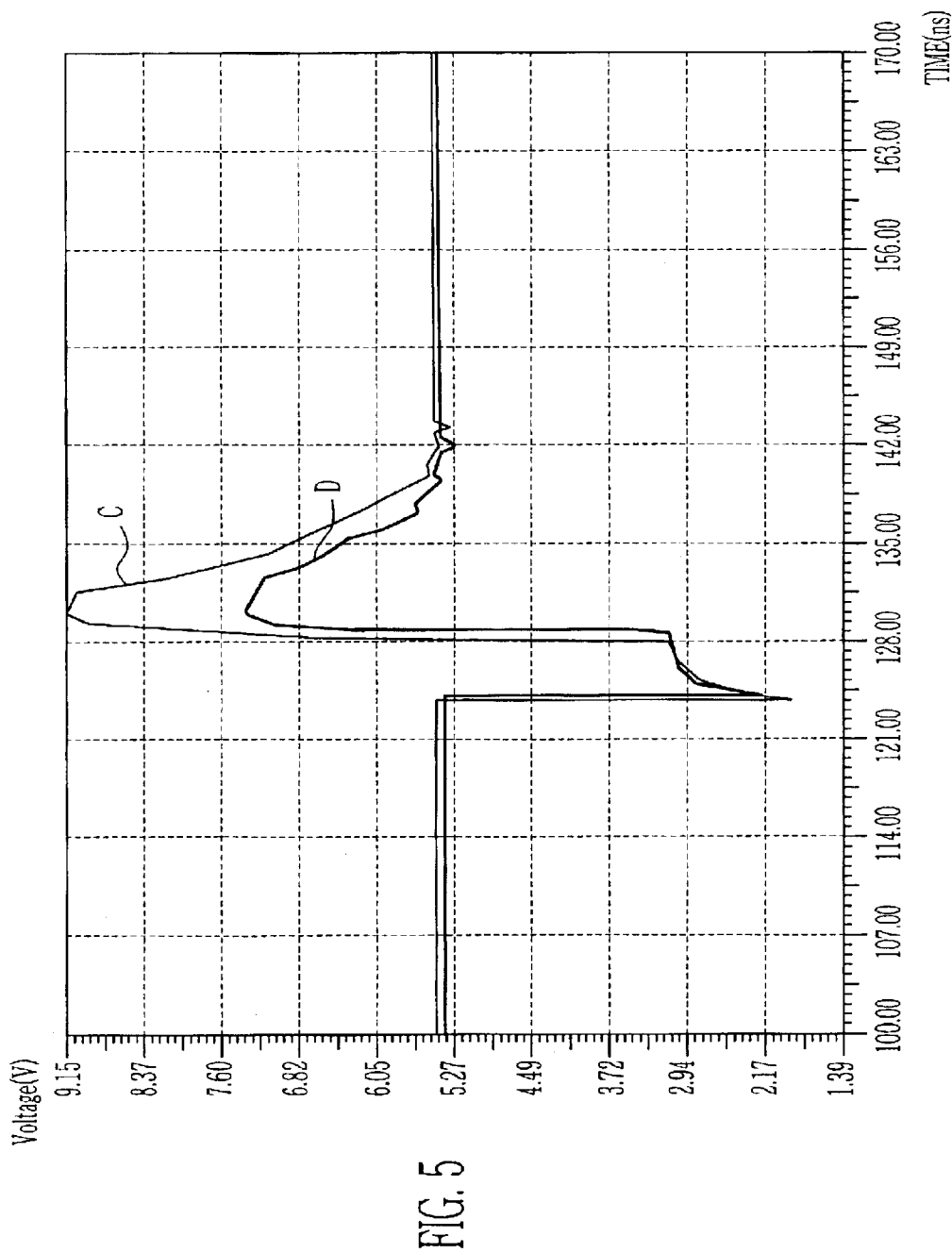
FIG. 5 shows a waveform illustrating variation in a word line voltage depending on the operation of a pre-select clamp circuit in the boosting circuit shown in FIG. 1.
Figure 6:
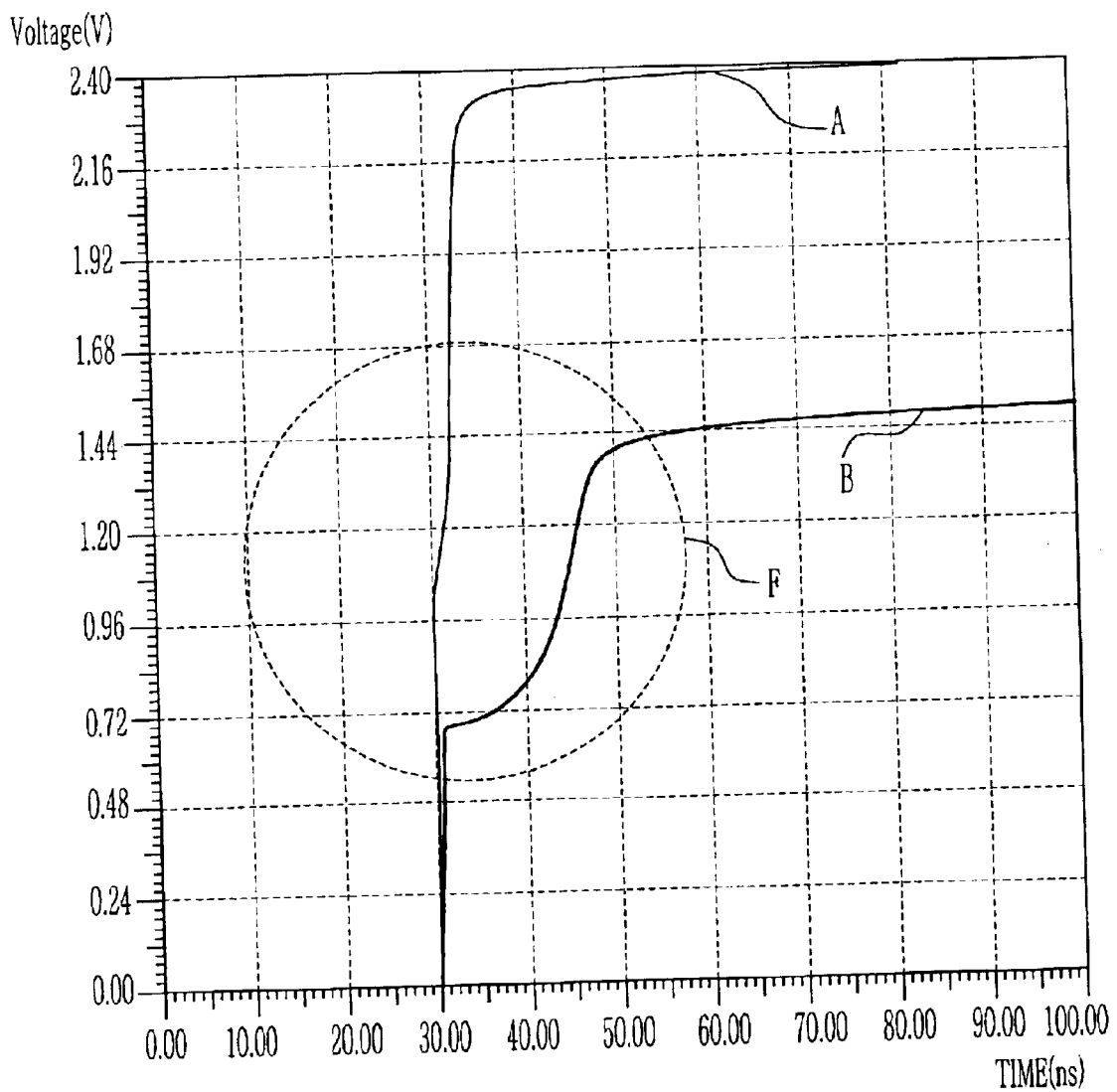
FIG. 6 shows a waveform of the bias voltage (Vbias) depending on the amount of the power supply voltage.
Figure 7:
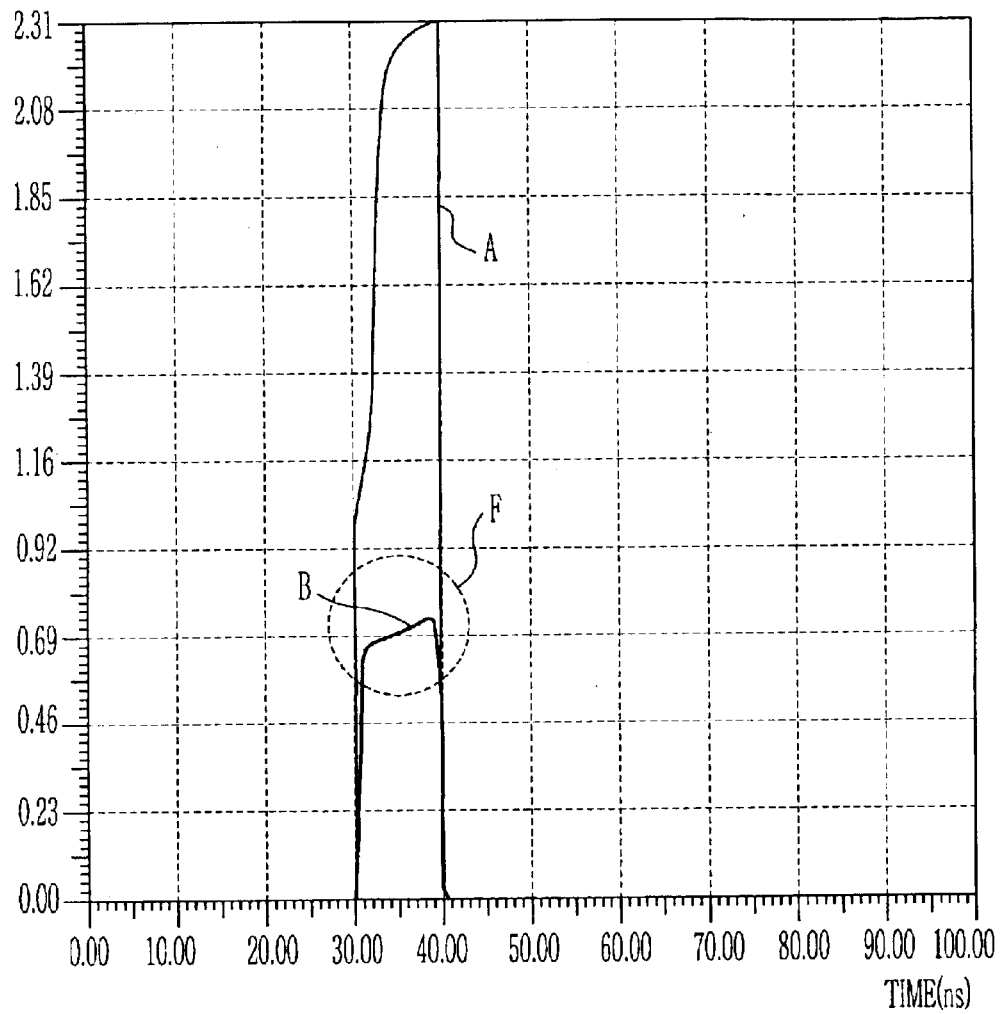
FIG. 7 shows a waveform of the bias voltage (Vbias) that enlarges a 'F' portion in FIG. 6.
Figure 8:
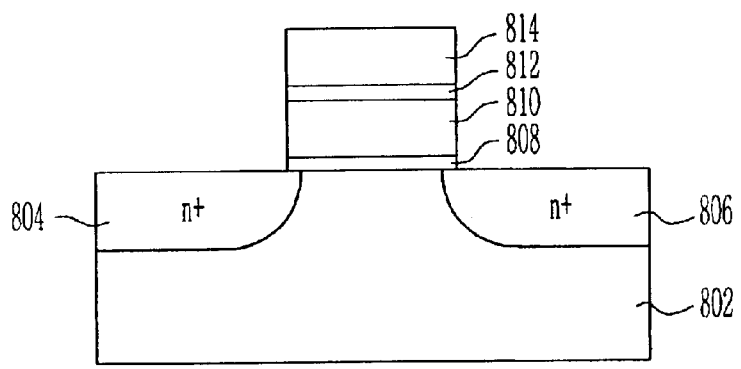
FIG. 8 is a cross sectional view of a common flash memory device.
Figure 9:
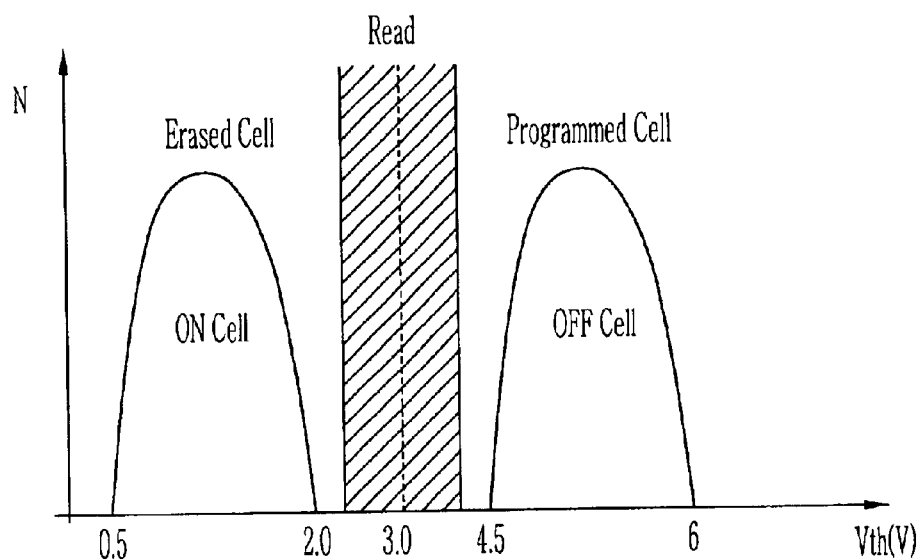
FIG. 9 is a graph showing distribution of the threshold voltage the memory cell depending on program and erase operations of the common flash memory device.
Figure 10:
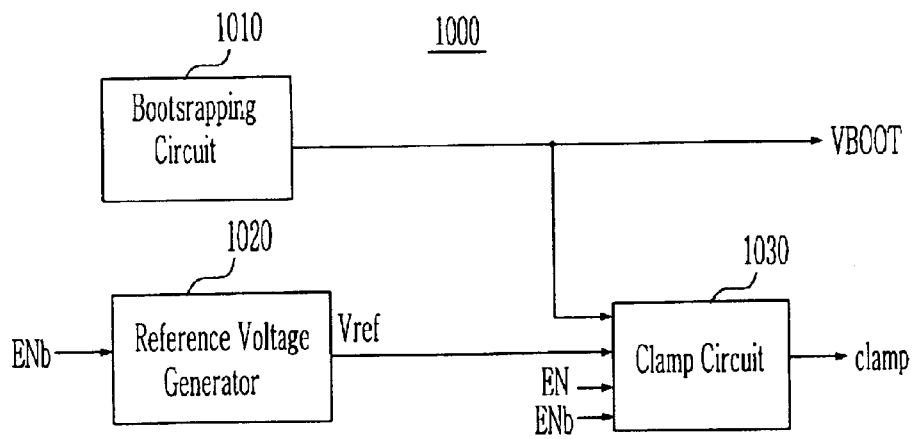
FIG. 10 is a block diagram of a common boosting circuit.
Figure 11:
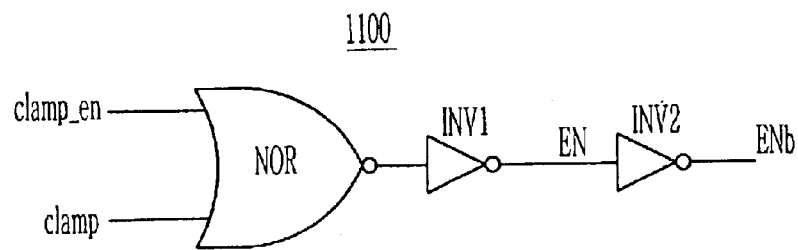
FIG. 11 is a circuit diagram of the enable signal generating circuit for generating the enable signal (EN) shown in FIG. 10.

An example of the operating characteristic of the boosting circuit according to a preferred embodiment of the present invention will described in detail by reference to FIG. 4 through FIG. 7. FIG. 4 shows the waveforms of the input/output signals (clamp_en, Vbias, VBOOT, W/L, etc.) of the boosting circuit, FIG. 5 shows a waveform of a simulation result for the word line voltage shown in FIG. 4, and FIG. 6 and FIG. 7 show waveforms of simulation results for the bias voltage (Vbias) shown in FIG. 4.

The operating characteristic of the boosting circuit 100 when the high-potential power supply voltage (HVcc) of 3.8V and the low-potential power supply voltage (LVcc) of 2.5V are applied, will be first described by reference to Table 2, FIG. 1, FIG. 4 through FIG. 7. In Table 2, it is assumed that the boosting ratio of the bootstrapping circuit 110 is 2.5 times, and the drop of the word line voltage depending on the voltage level of the bias voltage (Vbias) is 2V when the voltage level of the bias voltage (Vbias) is 2.4V and is 0.75V when the bias voltage (Vbias) is 0.7V.

TABLE 2

| clamp_en | clamp | EN | ENb | Vbias HVcc | Vbias LVcc | VBOOT HVcc | VBOOT LVcc | Word Line Voltage HVcc | Word Line Voltage LVcc |
|---|---|---|---|---|---|---|---|---|---|
| 0 (Low) | 0 | 0 | 1 | X | X | X | X | X | X |
| 0 | 1 (High) | 1 | 0 | X | X | X | X | X | X |
| 1 | 0 | 1 | 0 | 2.4 V | 0.7 V | 9.5 V | 6.25 V | 7.5 V | 5.5 V |
| 1 | 1 | 1 | 0 | 2.4 V | 0.7 V | 9.5 V | 6.25 V | 7.5 V | 5.5 V |

Referring to Table 2, FIG. 1 and FIG. 4, in a state that an address transition detection bar (ATDb) signal for detecting an address of a corresponding read memory cell is kept in a LOW state, if the clamp enable signal (clamp_en) is shifted from the LOW state to a HIGH state, the enable signal (EN) is shifted to the HIGH state by means of the enable signal generating circuit (see 300 in FIG. 3), regardless of the clamp signal (clamp).

Thereafter, as the enable signal (EN) is shifted to a HIGH state, the enable bar signal (ENb) is shifted to a LOW state and is then inputted to the bias voltage generating circuit (see 200 in FIG. 2). The bias voltage generating circuit 200 is synchronized by the enable bar signal (Enb) of the LOW state to output the bias voltage (Vbias). If the high-potential power supply voltage (HVcc) is applied to the power supply terminal (Vcc) of the bias voltage generating circuit 200, the bias voltage (Vbias) becomes a voltage level of 2.4V, as shown in the waveform A of FIG. 4 and FIG. 7. On the other hand, if the low-potential power supply voltage (LVcc) is applied, the bias voltage (Vbias) becomes a voltage level of 0.7V, as shown in waveform of FIG. 4 and FIG. 7. As such, the voltage level of the bias voltage (Vbias) is varied depending on the voltage applied to the power supply terminal (Vcc) of the bias voltage generating circuit 200.

The bias voltage (Vbias) waveforms described above are shown in the simulation result drawings of FIG. 6 and FIG. 7. Referring to FIG. 6 and FIG. 7, in a "F" portion, a point where the waveform A is rapidly increased but the waveform B is gently increased are generated. In other words, it can be seen that the rising time is different between the waveform A and the waveform B. Therefore, it is possible to obtain a stable word line voltage by controlling the drop of the boosting voltage (VBOOT) using the rising time between the two waveforms.

Meanwhile, the bias voltage (Vbias) outputted from the bias voltage generating circuit 200 is applied to the NMOS transistor (N1) of the pre-select clamp circuit 140. At this time, the NMOS transistor (N2) is in a stat that it is turned on by the clamp enable signal (clamp_en). The channel width of the NMOS transistor (N1) is different depending on the voltage level of the bias voltage (Vbias). In other words, the channel width of the NMOS transistor (N1) is large when the voltage level of the bias voltage (Vbias) is 2.5V than 0.7V. Therefore, the channel width of the NMOS transistor (N1) is large when the high-potential power supply voltage (HVcc) is applied than when the low-potential power supply voltage (LVcc) is applied, so that the drop of the voltage is high.

In other words, as shown in Table 2 and FIG. 5, if the high-potential power supply voltage (HVcc) is applied to the power supply terminal (Vcc) and the boosting voltage (VBOOT) becomes 9.5V (see waveform C in FIG. 5) through the bootstrapping circuit 110, the word line voltage of 7.5V (see waveform D in FIG. 5) (i.e., voltage before the voltage drop is generated through the clamp circuit) can be obtained. On the contrary, if the low-potential power supply voltage (LVcc) is applied and the boosting voltage (VBOOT) becomes 6.25V through the bootstrapping circuit 110 the low-potential power supply voltage (LVcc) is applied, the word line voltage of 5.5V can be obtained.

Next, if the high-potential power supply voltage (HVcc) is applied, the clamp circuit 130 is driven by the enable signal (EN) and the enable bar signal (ENb) to drop the boosting voltage (VBOOT) that is firstly dropped through the pre-select clamp circuit 140, so that a target word line voltage can be obtained. However, if the low-potential power supply voltage (LVcc) is applied, the clamp circuit 130 is not driven by the enable signal (EN) and the enable bar signal (ENb). Instead, the boosting voltage (VBOOT) that was firstly dropped through the pre-select clamp circuit 140 is used as the word line voltage, or the boosting voltage (VBOOT) outputted from the bootstrapping circuit 110 is intact used as the word line voltage. This can be selectively used in design.

From the above explanation, in the present invention, if the high-potential power supply voltage (HVcc) is applied, the boosting voltage (VBOOT) is firstly dropped to a given voltage through the pre-select clamp circuit, and the boosting voltage (VBOOT) is then dropped to a final target word line voltage through the clamp circuit. Also, if the low-potential power supply voltage (LVcc) is applied, the clamp circuit is not driven but the pre-select clamp circuit only is driven to drop the boosting voltage (VBOOT). This is because current loss of the clamp circuit is relatively high. In general, in order to obtain the target word line voltage, it is required the boosting voltage (VBOOT) for a long period of time through the clamp circuit. Accordingly, current loss is high since the clamp circuit must be driven for a long period of time.

Figure 12:
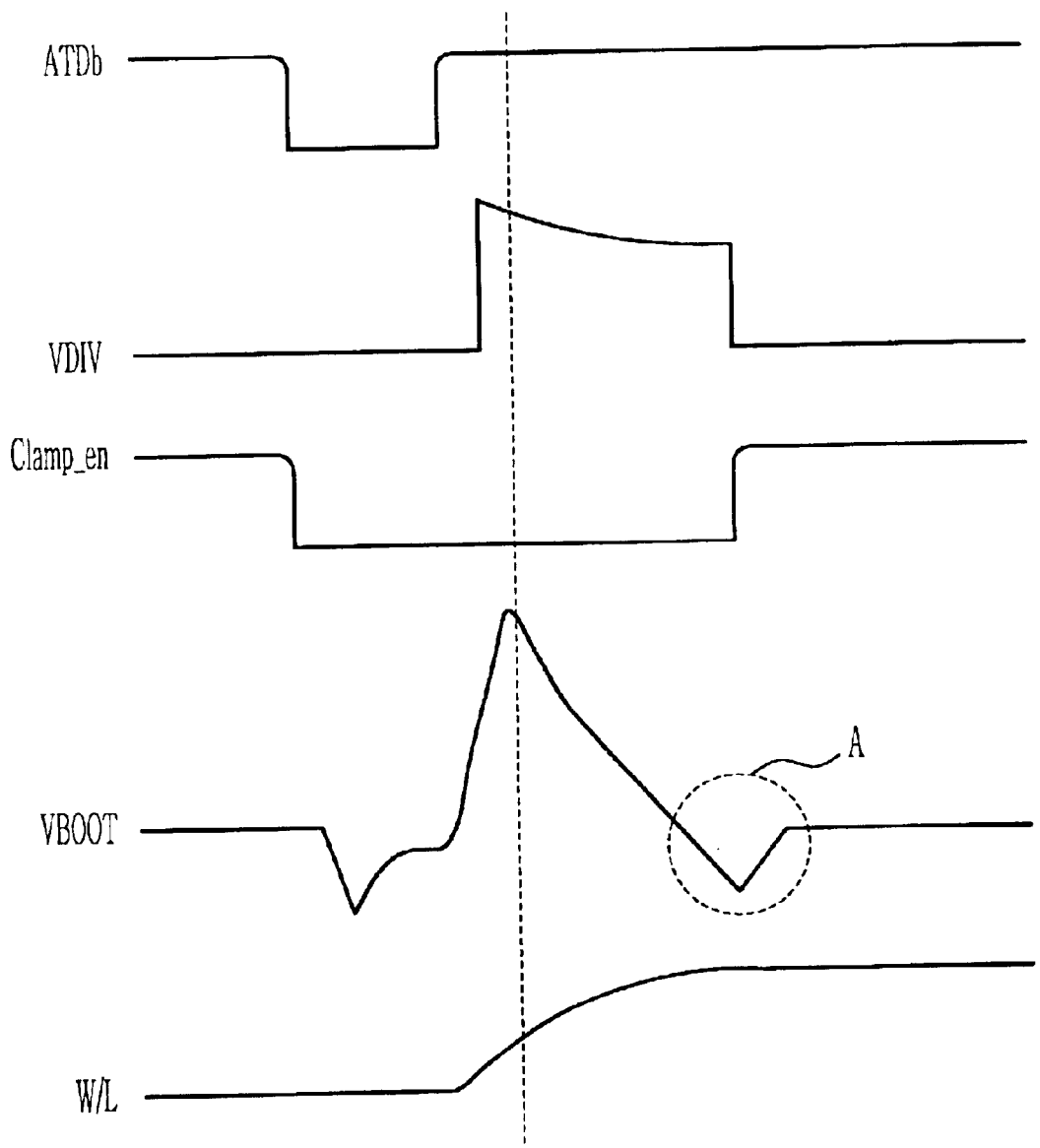
FIG. 12 is a waveform showing an operating characteristic of the boosting circuit shown in FIG. 10.

Therefore, in the present invention, if the high-potential power supply voltage (HVcc) is applied, in order to minimize current loss due to driving of the clamp circuit, the boosting voltage (VBOOT) is firstly dropped to a given level through the pre-select clamp circuit current loss of which is relatively small. Then, the clamp circuit is driven to drop the boosting voltage (VBOOT) for a short portion. Thereby, the boosting voltage (VBOOT) is in advance dropped to a given level through the pre-select clamp circuit so that the clamp circuit is driven for a short period of time by maximum. Further, if the low-potential power supply voltage (LVcc) is applied, consumption of current inevitably generating in a prior art can be prevented since the clamp circuit is not driven. Also, the present invention can prevent a conventional under shoot phenomenon that generates the portion A in FIG. 12. Meanwhile, W/L in FIG. 4 is a voltage that is finally applied to the word line.

As mentioned above, according to the present invention, if the high-potential power supply voltage (HVcc) is applied, the boosting voltage (VBOOT) is firstly dropped through the pre-select clamp circuit current loss of which is relatively small. Next, the boosting voltage (VBOOT) is dropped through the clamp circuit to generate a final target word line voltage. Therefore, the present invention has advantageous effects that it allows a rapid read access time upon a read operation, and can minimize the current consumption and obtain a stabilized word line voltage.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A boosting circuit, comprising:
   a bootstrapping circuit for boosting a first voltage to output a second voltage;
   a pre-select clamp circuit selectively driven by a bias voltage to drop the second voltage to a given voltage level, wherein the bias voltage is determined by the first voltage; and
   a clamp circuit for dropping the second voltage that is dropped by the pre-select clamp circuit to a target voltage.

2. The boosting circuit as claimed in claim 1, wherein the pre-select clamp circuit comprises a transistor in which the transistor is driven by the bias voltage, and the channel width of the transistor is changed by the bias voltage, and the discharge amount of the second voltage is determined by the channel width of the transistor so that the voltage drop level of the second voltage is controlled.

3. The boosting circuit as claimed in claim 1, wherein the pre-select clamp circuit comprises:
   a first transistor connected between an output terminal of the bootstrapping circuit and a node, and driven by the bias voltage; and
   a second transistor connected between the node and a ground terminal and driven by a clamp enable signal.

4. The boosting circuit as claimed in claim 3, wherein the first and second transistors are a NMOS transistor or a PMOS transistor.

5. The boosting circuit as claimed in claim 1, wherein the bias voltage is changed by the first voltage.

6. The boosting circuit as claimed in claim 1, wherein the bias voltage is generated by a bias voltage generating circuit by which the first voltage is dropped to a given voltage level, depending on an enable bar signal.

7. The boosting circuit as claimed in claim 6, wherein the bias voltage generating circuit comprises:
   an inverter for inverting the enable bar signal;
   a first NMOS transistor connected between the power supply terminal and an output terminal, and driven by an output signal of the inverter to send the first voltage inputted to the power supply terminal to the output terminal;
   a first PMOS transistor connected between the power supply terminal and a node, and driven by the output signal of the inverter to send the first voltage to the node;
   a second NMOS transistor connected between the output terminal and the ground terminal, and driven by the first voltage sent through the first PMOS transistor to ground the output terminal;
   a second PMOS transistor connected between the power supply terminal and the node and serving as a diode;
   a third NMOS transistor connected between the node and the ground terminal and driven by the voltage of the output terminal to send the voltage of the node;
   a fourth NMOS transistor connected between the third NMOS transistor and the ground terminal and driven by the first voltage; and
   a fifth NMOS transistor connected between the fourth NMOS transistor and the ground terminal and driven by an inverted signal of the inverter.

8. The boosting circuit as claimed in claim 6, wherein the bias voltage generating circuit is driven by the enable bar signal and then drops the first voltage to a given voltage level, depending on the first voltage, to generate the bias voltage.

9. The boosting circuit as claimed in claim 1, wherein the clamp circuit is not driven when the first voltage is the low-potential power supply voltage of about 2.5V.

10. The boosting circuit as claimed in claim 1, wherein the clamp circuit is driven by the enable signal.

11. The boosting circuit as claimed in claim 10, wherein the enable signal is generated by a logical combining unit that logically combines a clamp signal outputted from the clamp circuit and a clamp enable signal.

12. The boosting circuit as claimed in claim 11, wherein the logical combining unit includes a NOR gate, an OR gate, an AND gate, a NAND gate, an inverter, or combination more than one of them.

13. The boosting circuit as claimed in claim 11, wherein the logical combining unit outputs the enable signal of a LOW state when the clamp enable signal is in a HIGH state.

14. The boosting circuit as claimed in claim 1, further comprising a reference voltage generator for generating a reference voltage that is compared with the boosting voltage to output the reference voltage to the clamp circuit.

15. The boosting circuit as claimed in claim 1, wherein the first voltage is a low-potential power supply voltage of about 2.5V or a high-potential power supply voltage of about 3.8V.

* * * * *